(12) United States Patent
Mayder

(10) Patent No.: US 7,323,897 B2
(45) Date of Patent: Jan. 29, 2008

(54) MOCK WAFER, SYSTEM CALIBRATED USING MOCK WAFER, AND METHOD FOR CALIBRATING AUTOMATED TEST EQUIPMENT

(75) Inventor: Romi Mayder, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 47 days.

(21) Appl. No.: 11/014,473

(22) Filed: Dec. 16, 2004

(65) Prior Publication Data

US 2006/0132162 A1    Jun. 22, 2006

(51) Int. Cl.
  *G01R 31/26* (2006.01)
(52) U.S. Cl. .................................... 324/765
(58) Field of Classification Search ............... None
  See application file for complete search history.

(56) References Cited

U.S. PATENT DOCUMENTS

| | | | | |
|---|---|---|---|---|
| 5,014,003 A * | 5/1991 | Ishikawa | ...................... | 324/758 |
| 5,153,507 A * | 10/1992 | Fong et al. | .................. | 324/764 |
| 5,813,876 A * | 9/1998 | Rutigliano | .................. | 439/260 |
| 6,097,202 A * | 8/2000 | Takahashi | ................... | 324/761 |
| 6,103,134 A * | 8/2000 | Dunn et al. | .................... | 216/17 |
| 6,218,848 B1 * | 4/2001 | Hembree et al. | ........... | 324/754 |
| 6,221,682 B1 * | 4/2001 | Danziger et al. | ............. | 438/15 |
| 6,320,201 B1 * | 11/2001 | Corbett et al. | ................ | 257/48 |
| 6,326,555 B1 * | 12/2001 | McCormack et al. | ....... | 174/255 |
| 6,452,502 B1 * | 9/2002 | Dishongh et al. | ........... | 340/653 |
| 6,564,986 B1 * | 5/2003 | Hsieh | .......................... | 228/103 |
| 6,570,397 B2 | 5/2003 | Mayder et al. | | |
| 6,622,103 B1 | 9/2003 | Miller | | |
| 6,724,181 B2 | 4/2004 | Schittenhelm | | |
| 6,747,469 B2 * | 6/2004 | Rutten | ........................ | 324/765 |
| 6,765,298 B2 * | 7/2004 | Chin et al. | .................. | 257/776 |
| 6,940,301 B2 * | 9/2005 | Chen | .......................... | 324/770 |
| 7,102,372 B2 * | 9/2006 | Kuo | ............................ | 324/755 |
| 2004/0119487 A1 * | 6/2004 | Song et al. | ................. | 324/758 |
| 2004/0130344 A1 * | 7/2004 | Rohrbaugh et al. | ......... | 324/763 |
| 2005/0046412 A1 * | 3/2005 | Appen et al. | ............ | 324/158.1 |
| 2005/0200372 A1 * | 9/2005 | Bucksch | ..................... | 324/754 |

\* cited by examiner

*Primary Examiner*—Vinh Nguyen
*Assistant Examiner*—Richard Isla-Rodas

(57) ABSTRACT

In one embodiment, a mock wafer for calibrating automated test equipment includes a printed circuit board having a number of interconnect areas, with each interconnect area having a pair of mock die pads that are coupled via a connecting trace. In another embodiment, a method for calibrating automated test equipment (ATE) may include coupling the mock wafer to the ATE, and then causing the ATE to i) index the mock wafer with respect to a test head connector, ii) couple a number of probes or the test head connector to a number of the mock wafer's mock die pads, iii) transmit a test signal between a pair of the probes that are coupled via a pair of mock die pads and connecting trace of the mock wafer, and iv) calibrate a selected signal path or paths of the ATE by recording a characteristic of the transmitted test signal.

19 Claims, 4 Drawing Sheets

MOCK WAFER, SYSTEM CALIBRATED USING MOCK WAFER, AND METHOD FOR CALIBRATING AUTOMATED TEST EQUIPMENT

BACKGROUND

Prior to first use, and periodically thereafter, electronic circuit automated test equipment (ATE) needs to be calibrated to ensure that manufacturing variances in its signal paths, environmental conditions under which a device under test (DUT) is tested, and other factors, are taken into account when interpreting test data obtained from the ATE.

Typically, calibration comprises 1) sequentially connecting a reference channel of the ATE (e.g., a master clock source) to each of the other channels of the ATE, 2) transmitting a test signal after each sequential connection, and then 3) recording a characteristic of each transmitted test signal (e.g., recording a signal delay).

Traditionally, ATE has been calibrated using mechanical robots or relay matrices that sequentially connect the ATE's reference channel to each of the ATE's other channels. However, these solutions tend to be very expensive and require a significant amount of time to complete calibration. Furthermore, they usually undertake calibration in a "calibration environment" that may differ from a production test environment. For example, the calibration environment will typically not include a probecard (i.e., the custom interface that is designed to connect the ATE to a particular DUT (or DUT set) during production test).

Another way to undertake ATE calibration is via a custom-fabricated semiconductor wafer. The custom wafer may include more or less active circuitry (e.g., switching matrices), but in a simple embodiment merely comprises a plurality of custom dies, each of which has one or more pairs of pins that are interconnected via a circuit trace (or traces). An advantage of using a custom wafer is that it can be mounted to ATE similarly to a production wafer, thus enabling the calibration of ATE in light of probecard signal paths. However, custom-fabricated semiconductor wafers also tend to be very expensive, and their useful lives can be short (e.g., often, as a result of repeated probing, their die pads wear, leading to loss of die pad consistency and poor connectivity with ATE channels).

SUMMARY OF THE INVENTION

In one embodiment, a mock wafer for calibrating automated test equipment comprises a printed circuit board having a number of interconnect areas, with each interconnect area comprising a pair of mock die pads that are coupled via a connecting trace.

In another embodiment, a system comprises automated test equipment (ATE), a mock wafer, and a calibration program. The ATE comprises a processor, and a test head connector that is coupled to a plurality of signal paths of the ATE. The mock wafer comprises a printed circuit board (PCB) having a number of interconnect areas, with each interconnect area comprising a pair of mock die pads that are coupled via a connecting trace. The calibration program is executed by the processor to cause the ATE to i) index the mock wafer with respect to the test head connector, ii) couple a number of probes of the test head connector to a number of the mock wafer's die pads, iii) transmit a test signal between a pair of the probes that are coupled via a pair of mock die pads and connecting trace of the mock wafer, and iv) calibrate a selected signal path or paths of the ATE by recording a characteristic of the transmitted test signal.

In yet another embodiment, a method for calibrating automated test equipment (ATE) comprises coupling a mock wafer to the ATE. The mock wafer comprises a printed circuit board (PCB) having a number of interconnect areas, with each interconnect area comprising a pair of mock die pads that are coupled via a connecting trace. After coupling the mock wafer to the ATE, the ATE is caused to i) index the mock wafer with respect to a test head connector, ii) couple a number of probes of the test head connector to a number of the mock wafer's mock die pads, iii) transmit a test signal between a pair of the probes that are coupled via a pair of mock die pads and connecting trace of the mock wafer, and iv) calibrate a selected signal path or paths of the ATE by recording a characteristic of the transmitted test signal.

Other embodiments are also disclosed.

BRIEF DESCRIPTION OF THE DRAWINGS

Illustrative and presently preferred embodiments of the invention are illustrated in the drawings, in which.

DETAILED DESCRIPTION OF AN EMBODIMENT

During wafer level acceptance testing, ATE subjects a number of die (i.e., electronic circuits) on a semiconductor wafer to a battery of tests to determine whether the die pass and should be accepted, or whether they fail and should be rejected. If a die passes, it may proceed to be diced, packaged and used or sold.

Figure 4:
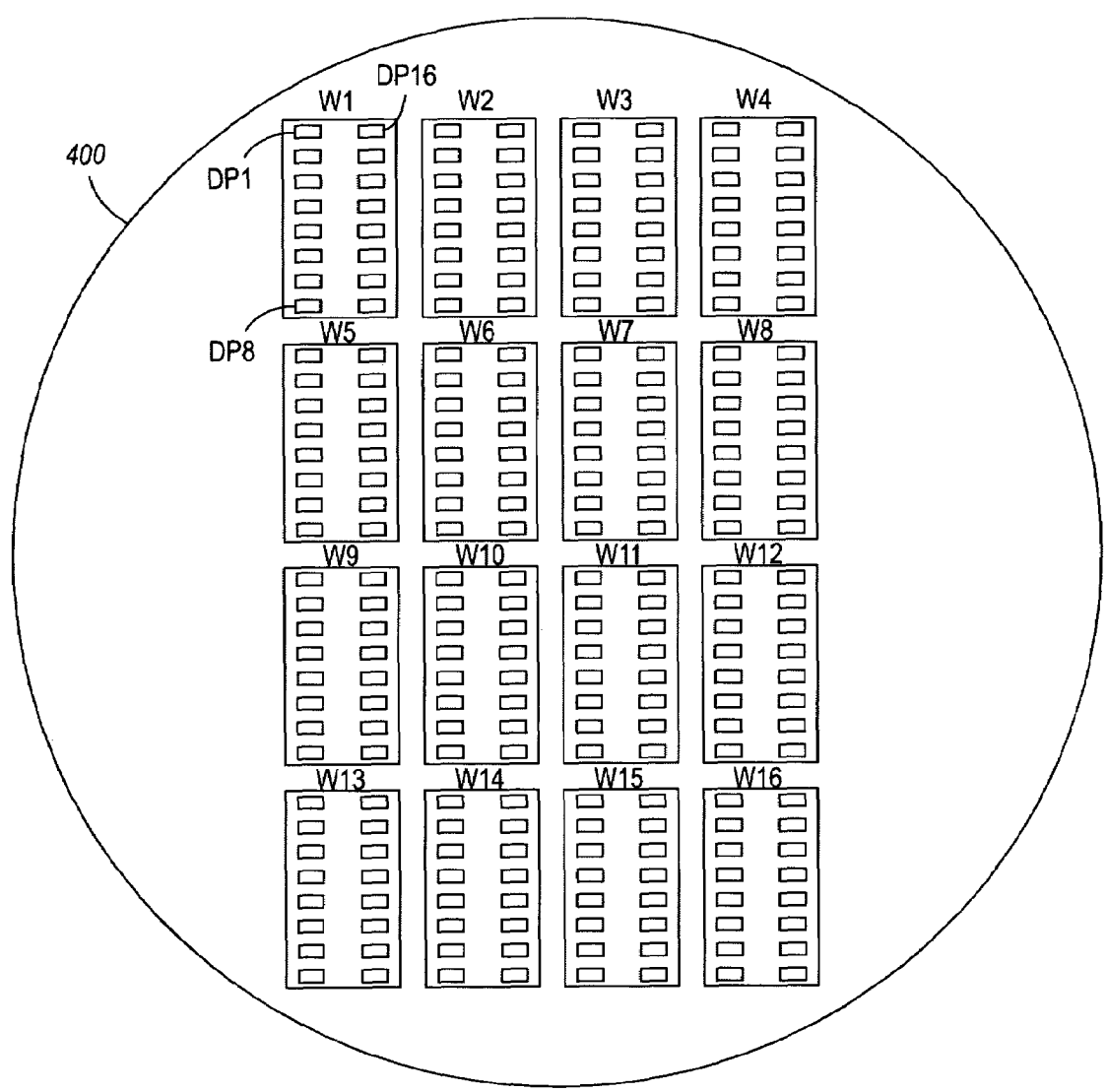
FIG. 4 illustrates an exemplary production wafer.

Generally, wafers are densely populated, having from several to several hundred die fabricated thereon. Each die, in turn, may comprise several to several hundred die pads for power, ground, and I/O (input/output) connections. As a result, the density of die pads per wafer may soar into the thousands. By way of example, FIG. 4 illustrates a relatively simple wafer 400 having sixteen die thereon (W1-W16), each having a set of sixteen die pads (DP1-DP16).

During acceptance testing, ATE physically contacts the die pads on the wafer 400. Often, ATE is fitted with a connector (e.g., a probecard) that serves as an interface between a specific DUT wafer and the more generic (or adaptable) I/O pins of the ATE. In some cases, the probecard may be able to contact all of the die pads of a wafer at once. However, although ATE may be provided with several hundred to several thousand signal paths (or channels) via which wafer testing can be conducted, ATE is often unable to simultaneously carry out tests on all of the die pads of a wafer. As a result, a probecard will typically comprise a layout of probes (e.g., micro-needles or spring pins) that are designed to contact a subset of the die pads on a wafer, such as all of the die pads of a particular set of die. After conducting a number of tests on the subset of die pads, the ATE will then index (move) the probecard with respect to the wafer and touch down on a different set of its die pads. In some cases, the actions of indexing, touching down, and performing a series of tests may be repeated several times.

Figure 5:
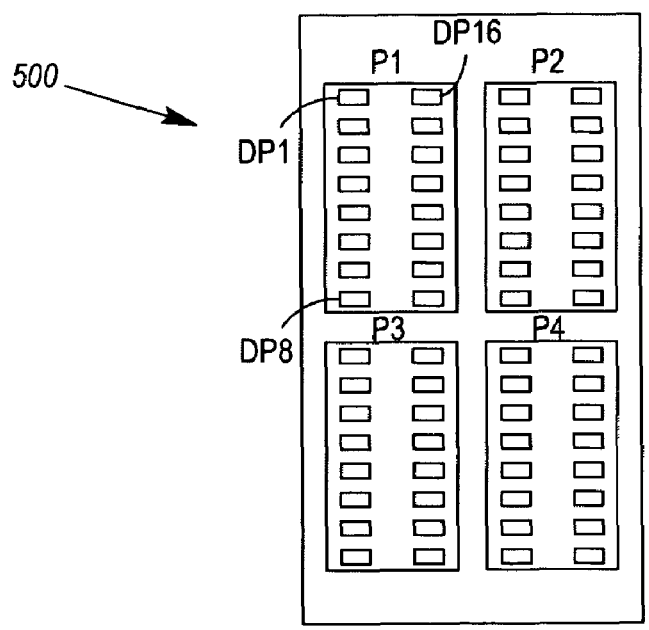
FIG. 5 illustrates an exemplary probecard that may be mated to automated test equpiment for probing the wafers shown in FIGS. 1 & 4.

By way of example, FIG. 5 illustrates a relatively simple probecard 500. The probecard 500 comprises four sets of sixteen probes, P1-P4, that allow the probecard 500 to index and touch down on different subsets of four die on the wafer 400 (i.e., for parallel testing of the die). Generally, each probe of a probecard will be coupled to one ATE signal path or channel. Thus, the sixty-four probes of the probecard 500 would be respectively coupled to sixty-four different ATE signal paths. However, the number of ATE signal paths is not always equivalent to the number of ATE channels. For example, in cases of multiplexing, multiple channels may be coupled to one probe, or multiple probes may be coupled to one channel, thereby creating more signal paths than there are probes or channels.

Figure 6:
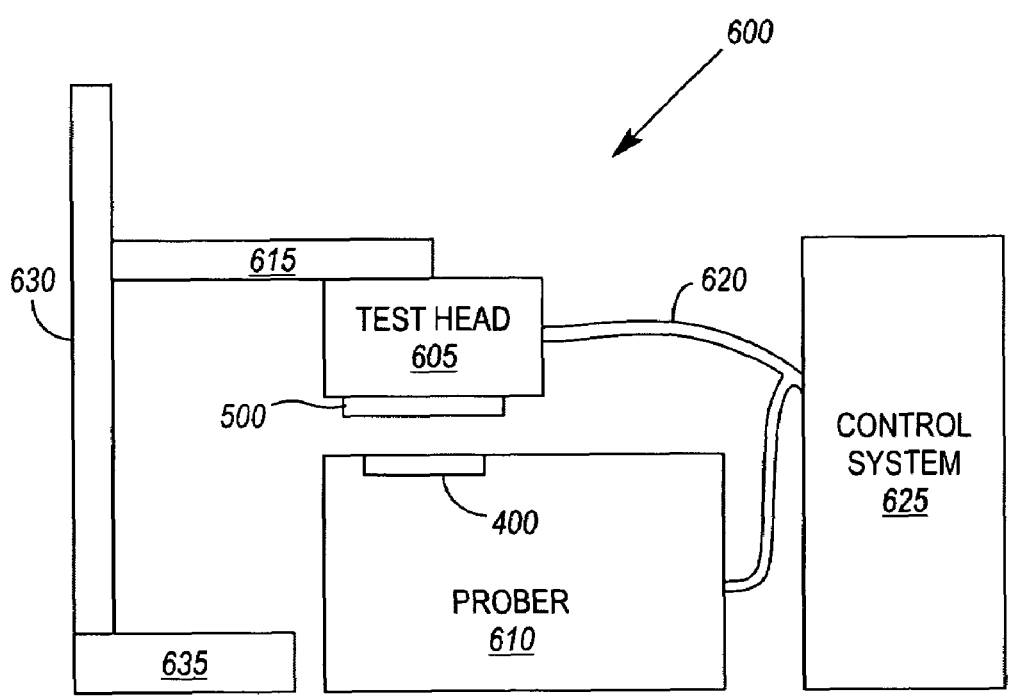
FIG. 6 illustrates an exemplary automated test equipment system that may use the wafers and probecard shown in FIGS. 1, 4 & 5.

FIG. 6 illustrates an exemplary ATE system 600. For purposes of this discussion, the structure of the ATE system 600 has been simplified. The ATE 600 comprises a test head 605, a prober 610, a test head support arm 615, a cable conduit 620, a control system 625, an arm manipulator 630, and an arm counterbalance 635. The conduit 620 may comprise one or more cables that carry various test and control signals between the test head 605, the prober 610, the arm manipulator 630 and the control system 625.

The control system 625 may comprise various components, including one or more processors, memory, signal generators, and signal analyzers. A test program that defines test and control information for operating the ATE in an automated way may be stored in the memory of the control system 625 and be executed by its processor(s). In this manner, wafer testing may be completed with little or no user input.

In operation, the arm manipulator 630 moves the test head 605 up and to one side so that a probecard 500 may be coupled to the testhead 605 and a wafer 400 may be coupled to the prober 610. In some systems, a cassette (not shown) may be provided for automatically loading and unloading a series of wafers in/from the ATE 600. After loading a wafer 400, the arm manipulator 630, test head 605 and/or prober 610 moves the probecard 500 or wafer 400 to index (i.e., align) the wafer 400 with respect to the probecard 500 and touch down on a set of die pads of the wafer 400.

One exemplary ATE system is the 4,608 channel Versatest Series Model V5400, available from Agilent Technologies, Inc., located in Palo Alto, Calif. (USA).

Prior to first use, and periodically thereafter, ATE needs to be calibrated to ensure that manufacturing variances in its signal paths, environmental conditions under which a DUT is tested, and other factors, are taken into account when interpreting test data obtained from the ATE. Calibration is becoming evermore critical as die are being designed to operate at higher speeds and under closer tolerances.

Figure 1:
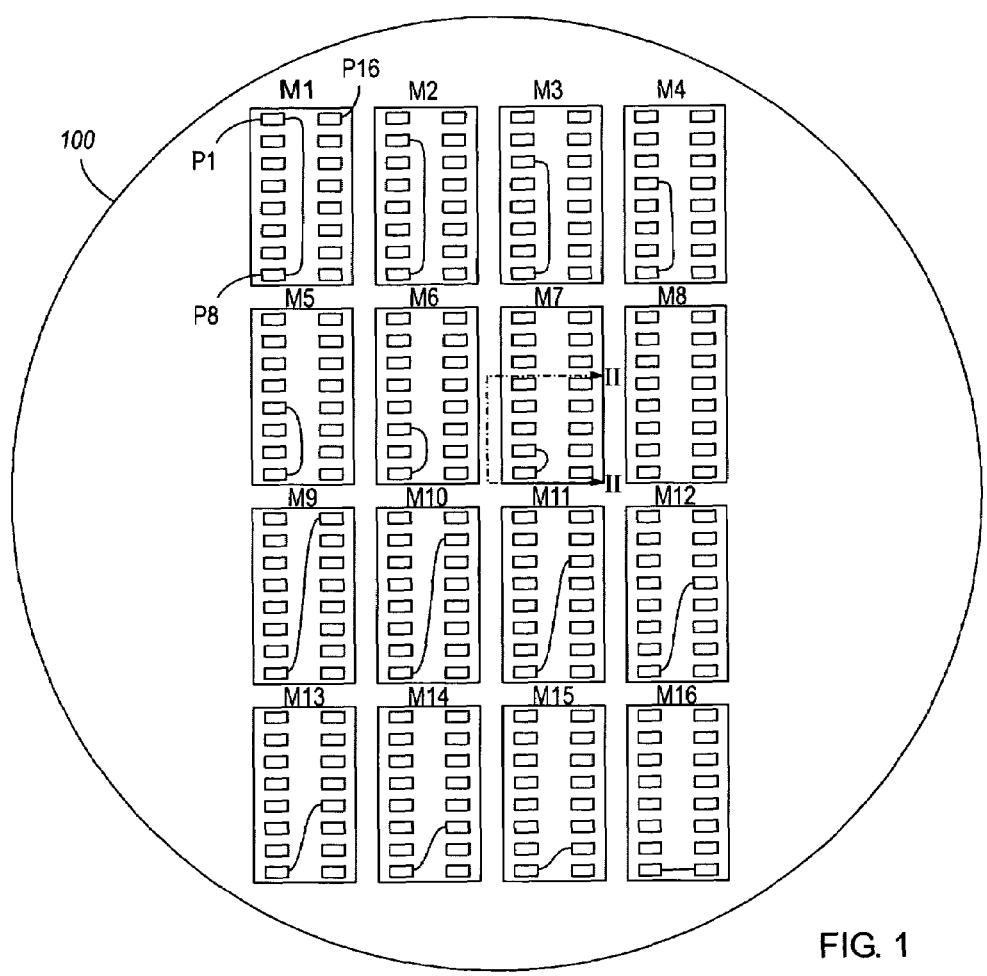
FIG. 1 illustrates the layout of an exemplary mock wafer.

FIG. 1 illustrates the layout of an exemplary mock wafer 100 comprising sixteen interconnect areas, M1-M16, each having sixteen mock die pads, DP1-DP16. As shown, the interconnect areas may take the form of "mock die". That is, each interconnect area may comprise a number and arrangement of die pads that mimics the number and arrangement of die pads on a production die (e.g., one of die W1-W16). In some cases, an interconnect area may comprises fewer die pads than a production die. However, in order to mitigate damage to the probes of a probecard 500, each interconnect area should preferably provide a metallic pad, ground plane, or common plane for each of the probes of a probecard 500 to touch down on.

The interconnect areas or "mock die" are so-named because they are not functioning, production die. Rather, each of the interconnect areas comprises a pair of mock die pads that are coupled via a connecting trace. Preferably, the coupled die pads have a relationship that corresponds to a relationship between a pair of production die pads. In this manner, and as will be explained more fully below, ATE calibration may be performed using the probecard that will actually be used in production testing, thereby enabling calibration of ATE in the context of the production probecard.

In some cases, each of the interconnect areas on a mock wafer may comprise a unique pair of connected mock die pads. For example, FIG. 1 illustrates a mock wafer 100 comprising sixteen unique mock die, M1-M16. By way of example, die pad DP8 is presumed to correspond to a probecard probe that is connected to a reference channel of the ATE 600. As known in the art, a reference channel may provide a master clock signal or the like to which all channels of ATE may be calibrated in a relative manner. For example, during AC calibration, a clock signal may be transmitted between the ATE's reference channel and each of the ATE's other channels. A transmission delay may then be recorded for each of the ATE's channels so that inherent delays of the ATE may be factored out of any timing delays acquired from a DUT during production test.

If a set of probecard probes such as those shown in set P1 of probecard 500 are sequentially indexed to and touched down on each of the sixteen mock die shown in FIG. 1, each of the probecard's probes, and the ATE channels they are connected to, may be calibrated with respect to a channel of the ATE (e.g., a reference channel) coupled to mock die pad DP8.

In FIG. 1, mock die M8 represents a connection of reference die pad DP8 to itself. This mock die may therefore be used to perform shorts testing on the ATE 600, or it may be eliminated, thereby reducing the count of mock die that need to be formed on the mock wafer 100. In some cases, other mock die may also be eliminated. For example, those mock die that might couple power or ground pads of a production die to a reference pad can be eliminated.

In some cases, all of the mock die pads corresponding to ground pads on a production wafer 400 may be interconnected and coupled to a ground of the ATE 600. This may be accomplished, for example, by coupling the mock die pads to a grounded probe of a probecard 500, or by coupling the mock die pads to a grounded layer of the mock wafer 100. In a similar fashion, all mock die pads corresponding to power pads on a production wafer 400 may be interconnected (and may or may not be coupled to power via the ATE 600). Whether or not similarly designated power and ground pads are coupled together on the mock wafer 100, or to ground or power through corresponding probecard probes, may depend on the kind of calibration being performed using the mock wafer 100. For example, certain calibration procedures may require a certain characteristic impedance to achieve an accurate result, in which case coupling together all signal paths that are coupled to commonly designated pads may cause inaccurate results. It should be understood that any number of mock wafers and mock die configurations are possible, thereby allowing the ground and power paths on some mock wafers to be coupled, while the ground and power paths on other mock wafers are not.

Figure 2:
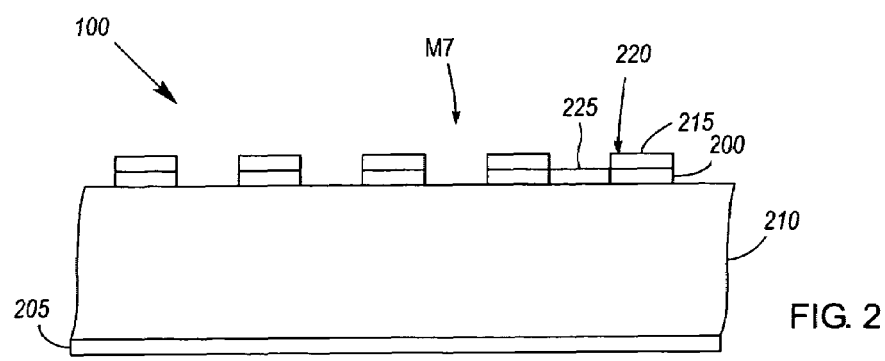
FIG. 2 illustrates exemplary PCB layers of the mock wafer shown in FIG. 1.

The mock wafer 100 is preferably constructed using printed circuit board (PCB) technology. Thus, mock wafer 100 is not a semiconductor wafer, but rather a PCB wafer. FIG. 2 illustrates an exemplary two-layer construction of the mock wafer 100. That is, the mock wafer 100 shown in FIG. 2 comprises two metal layers 200, 205, separated by a dielectric layer 210. Mock die pads and connecting circuit traces may be formed in the upper metal layer 200, while the lower metal layer 205 may provide additional rigidity and possibly a ground plane for the mock wafer 100.

In one embodiment, the dielectric layer 210 may comprise FR-4 material (i.e. flame retardant fiberglass 4) having a thickness of 10 mils (0.01 inches). A two-layer PCB having an FR-4 dielectric layer is desirable in that it can easily be formed to match the flatness and thickness of a production wafer 400. However, other materials may also be suitable for the dielectric layer 210.

By way of example, the two metal layers 200, 205 may comprise 0.5 ounce or 0.65 mil (0.00065 inches) thick copper. In some embodiments, optional plating 215 may be applied to the pads (e.g., pad 220) and traces 225 of the mock wafer 100. For example, the pads 220 and traces 225 may be plated with 200 microns (0.0002 inches) of nickel and 50 microns (0.00005 inches) of hard gold (e.g., a mixture of 99.7% gold and 0.3% cobalt). Alternately, other plating thicknesses and materials may be substituted or additionally applied. Plating offers increased hardness that can endure thousands of probecard touch downs without fail. Preferably, plating thicknesses are considered in the context of the mock wafer's thickness as a whole. In this manner, the heights of mock die pads on a PCB can be substantially matched to the heights of production die pads on a production wafer 400.

In some embodiments, the second metal layer 205 may comprise a highly conductive metal (e.g., copper) that provides a good ground plane, and the thickness of the dielectric layer 210 may be controlled to provide a uniform characteristic impedance (e.g., 50 ohms) for all metallization formed in the first metal layer 200. However, in some embodiments, the second metal layer 205 may be a poor conductor, or may be replaced with a non-conductor. That is, in some cases, the layer 205 may not provide a ground plane for the mock wafer 100, but merely provide planarity and rigidity for the mock wafer 100. In fact, depending on the size and required handling of a mock wafer 100, some embodiments of a mock wafer 100 may not even require the layer 205.

Some embodiments of the mock wafer 100 may comprise more than two metal layers 200, 205 and/or interconnectivity (e.g., vias) between metal layers. However, the use of additional metal layers, and vias between metal layers, can make the flatness and thickness of a mock wafer 100 more difficult to control, thus interfering with a mock wafer's ability to mimic a corresponding production wafer.

As alluded to earlier, a uniform characteristic impedance may desired for metallization in the first metal layer 200. For example, in order to maintain a 50 ohm impedance, the mock wafer 100 may comprise a 10 mil dielectric layer 210 in combination with first metal layer traces having a width of 10 mils.

In some embodiments, interconnect areas may be provided with more than one pair of interconnected mock die pads—especially in the case where each channel of ATE is calibrated with respect to each other channel (instead of only being calibrated to a reference channel). Interconnect areas of the mock wafer may also interconnect more than two mock die pads. However, this will often lead to loss of characteristic impedance, as well as undesirable signal reflections (although increasing or decreasing the thickness of the dielectric layer 210, or providing a stable ground layer 205, may mitigate these effects).

In some embodiments, the mock wafer 100 may comprise a plurality of uniquely configured mock die, while in other embodiments the mock wafer 100 may comprise only a single mock die, a plurality of the same mock die, or various combinations of unique and replicated mock die. For example, the same mock die configuration may be repeated on a mock wafer to form a pattern or matrix of mock die, each having the same configuration, to enable a probecard 500 to touch down once for calibrating the connected signal paths of its probe sets, P1-P4, in parallel. Other mock wafers may comprise patterns or matrices of other uniquely configured mock die for connecting other probes/signal paths for parallel calibration during a single touch down. Although arranging patterns of mock die each having the same configuration (repetitiously configured mock die patterns) may lead to fewer indexing and touch down steps, it can also lead to a requirement for additional mock wafers. This tradeoff may be resolved one way or the other, depending on a particular set of circumstances.

In cases where interconnect areas do not provide a full set of mock die pads, it may be possible to increase the density of interconnected mock die pads on a mock wafer 100. However, it is preferable that each interconnect area comprise a full set of mock die pads, thereby enabling a mock wafer to more closely replicate the conditions under which ATE will test a production wafer 400. It is also preferred that each mock die pad be plated with a noble metal to mitigate contamination and/or injury to a probecard's probes.

In some embodiments, more than one mock wafer may be required to accomplish calibration. For example, when die have 512 pins (die pads); only 256 of them fit on one wafer, and only one connection is made per mock die, then two mock wafers with 256 mock die on each mock wafer would be required to provide 512 connections to test each signal path coupled to a probecard probe. Further, prober mobility limitations, and the placement of mock die on a mock wafer, may cause a need for more than one mock wafer. If provided, the one or more mock wafers may be loaded into an ATE cassette (not shown) for automatic loading and unloading.

Figure 3:
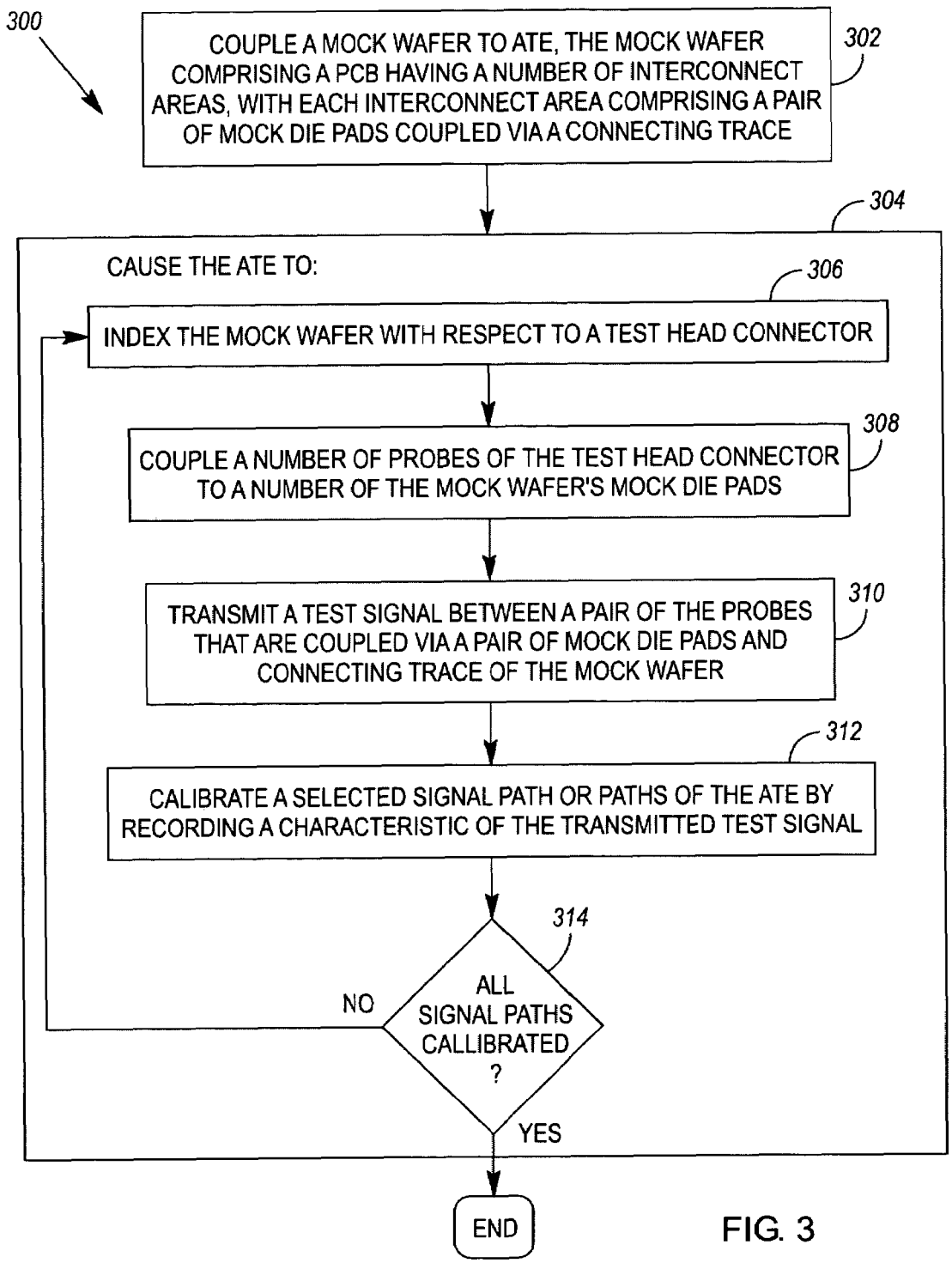
FIG. 3 illustrates an exemplary method for calibrating automated test equipment.

An exemplary method 300 for calibrating ATE 600 is illustrated in FIG. 3. The method 300 begins with the coupling 302 of a mock wafer 100 to the ATE 600. By way of example, the mock wafer 100 may comprise a PCB having a number of interconnect areas, each of which comprises a pair of mock die pads that are coupled via a connecting trace.

The method 300 continues when ATE 600 is caused 304 to 1) index 306 the mock wafer 100 with respect to a test head connector (e.g., a probecard 500), 2) couple 308 a number of probes of the test head connector 500 to a number of the mock wafer's mock die pads, 3) transmit 310 a test signal between a pair of probes that are coupled via a pair of mock die pads and connecting trace of the mock wafer 100, and 4) calibrate 312 a selected signal path or paths of the ATE 600 by recording a characteristic of the transmitted test signal. By way of example, the recorded signal characteristic may be a transmission delay.

Depending on the configuration of the ATE 600, the indexing between the mock wafer 100 and test head connector 500 may be carried out by moving the test head 605, prober 610, or both.

In some cases, the method 300 may continue with a determination 314 of whether all signal paths have been calibrated and, if some signal paths have not been calibrated, the actions 306-310 may be repeated with a different indexing of the mock wafer 100 and test head connector 500.

In some embodiments, the method 300 may be implemented by means of a calibration program that is stored, for example, in a memory of the control system 625 of the ATE 600.

In accordance with one exemplary calibration procedure, a calibration program may first cause probe set P4 (FIG. 5) to touch down on mock die M1. After transmitting a test signal and performing a calibration, the calibration program may then cause a re-indexing of the mock wafer 100 and probecard 500 so that probe sets P3 and P4 touch down on mock die M1 and M2. After transmitting a test signal and performing a calibration, the calibration may re-index the mock wafer 100 and probecard 500 additional times so that probe sets P3 and P4 index all of the mock die in the first row of the mock wafer 100. Thereafter, the mock wafer 100 and probecard 500 can be indexed so that probe sets P2 and P4 index mock die M1 and M5. Such re-indexing continues until each of the probe sets, P1-P4, has indexed each of the mock die, M1-M16, and a calibration reading has been acquired with respect to each combination of probe set and mock die.

The precise number of indexes and touch downs during any calibration procedure will depend on the design of a particular probecard 500 and mock wafer 100 (including their size and number of probes or die pads), as well as the nature of a calibration program. In order to minimize the number of touch downs needed to calibrate all signal paths through a probecard 500, a mock wafer may comprise mock die repetitions (i.e., two or more of the same mock die on a single wafer). A probecard 500 may also be calibrated using more than one mock wafer (with each mock wafer having different types or patterns of interconnect areas thereon).

A variety of ATE and probecard calibrations may be performed using the above-described methods. For example, an AC timing (i.e. path delay or deskew) calibration may inject a clock or other signal through a reference channel, and then detect the clock signal via each of a number of other ATE channels as the channels are coupled to the reference channel via touch downs on the different die of a mock wafer.

In some embodiments, each signal path is deskewed relative to a reference path for each mock die. The deskew test results are relative to the reference, as opposed to absolute. A relative delay is used to calibrate each signal path relative to the reference signal path. The set of relative delays for a mock die may be normalized to the shortest relative delay (i.e., the relative delays become relative to the shortest relative delay). In some embodiments the relative delay data may be adjusted in accordance with differing connecting trace lengths (e.g., when the lengths of traces connecting different pairs of mock die pads differ).

Mock wafers and accompanying calibration procedures disclosed herein allow probecards to be designed without reference to calibration, thereby avoiding additional probes and complexity to probecard design and manufacturing along with greater accuracy. Also, the same probecards used during calibration may be used during production test. Further, the mock wafers may be made to endure numerous contacts, and may sometimes be probed thousands of times before wearing out. Further still, mock wafers based on PCB technology are typically orders of magnitude less costly than custom semiconductor wafers, and are much more durable than semiconductors wafers. Even further, mock wafers based on PCB technology can be easily matched to the mechanical dimensions of a wafer (e.g., thickness and flatness)—especially in the case of PCBs comprising only two metal layers.

Using the above-described methods and apparatus, ATE calibration may often be performed at a lower cost than is possible with custom semiconductor wafers, yet with the same speed and accuracy.

What is claimed is:

1. A mock wafer for calibrating automated test equipment, the mock wafer comprising:
   a printed circuit board having a number of interconnect areas, with each interconnect area comprising a pair of mock die pads that are coupled via a connecting trace, and with each pair of the mock die pads configured for touchdown thereon by probes of the automated test equipment.

2. The mock wafer of claim 1, wherein the mock die pads of each pair have a relationship that corresponds to a relationship an arrangement between a pair of production die pads of a production wafer used normally for calibrating automated test equipment.

3. The mock wafer of claim 1, wherein the printed circuit board has a plurality of said interconnect areas, each of which comprises a unique pair of connected mock die pads.

4. The mock wafer of claim 3, wherein each unique pair of connected mock die pads has an arrangement that comprises i) a first mock die pad corresponding to a single production die pad, and ii) a second mock die pad corresponding to a unique other production die pad.

5. The mock wafer of claim 1, wherein each interconnect area forms a mock die with a set of mock die pads equal in number to a set of die pads on a production die.

6. The mock wafer of claim 1, wherein the printed circuit board has a number of die pads on said interconnect areas equal to a number of die pads on a production die, less a number of reference, ground and power pads on the production die.

7. The mock wafer of claim 1, wherein the printed circuit board comprises only two metal layers, separated by a dielectric layer.

8. The mock wafer of claim 7, wherein thicknesses of the metal and dielectric layers are chosen to provide a fifty ohm (50 Ω) impedance for traces formed in one of the metal layers.

9. The mock wafer of claim 8, wherein there are no conductive paths coupling the two metal layers.

10. The mock wafer of claim 1, wherein heights of the mock die pads on said printed circuit board substantially match heights of production die pads on a production water.

11. The mock wafer of claim 1, wherein the mock die pads are plated with nickel and hard gold.

12. A system, comprising:
   automated test equipment (ATE) comprising i) a processor, and ii) a test head connector that is coupled to a plurality of signal paths of the ATE;
   a mock wafer comprising a printed circuit board (PCB) having a number of interconnect areas, with each interconnect area comprising a pair of mock die pads that are coupled via a connecting trace, and with each pair of the mock die pads configured for touchdown thereon by probes of the automated test equipment; and
   a calibration program, executed by me processor, that causes the ATE to i) index the mock wafer with respect to the test head connector, ii) couple a number of probes of the test head connector to a number of the mock wafer's die pads, iii) transmit a test signal between a pair of the probes that are coupled via a pair of mock die pads and connecting trace of the mock wafer, and iv) calibrate a selected signal path or paths of the ATE by recording a characteristic of the transmitted test signal.

13. The system of claim 12, wherein the test head connector comprises a probecard.

14. The system of claim 12, wherein the calibration program causes the ATE to repeat said indexing, coupling, test signal transmission and calibration; and wherein each repetition is associated with a different indexing of the mock wafer and test head connector.

15. The system of claim 14, wherein each of said pairs of mock die pads comprise a mock die pad positioned to be coupled to a reference channel of the ATE.

16. The system of claim 12, further comprising a number of additional mock wafers, each comprising a PCB having a number of interconnect areas comprising a pair of mock die pads that are coupled via a connecting trace; wherein each of the additional mock wafers has a pattern of interconnect areas that differs from the pattern of interconnect areas of other ones of the mock wafers.

17. A method for calibrating automated test equipment (ATE), comprising:

coupling a mock wafer into the ATE, the mock wafer comprising a printed circuit board (PCB) having a number of interconnect areas, with each interconnect area comprising a pair of mock die pads that are coupled via a connecting trace, and with each pair of the mock die pads configured for touchdown thereon by probes of the ATE; and causing the ATE to I) Index the mock wafer with respect to a test head connector, ii) couple a number of probes of the test head connector to a number of the mock wafer's mock die pads, iii) transmit a test signal between a pair of the probes that are coupled via a pair of mock die pads and connecting trace of the mock wafer, and iv) calibrate a selected signal path or paths of the ATE by recording a characteristic of the transmitted test signal.

18. The method of claim 17, wherein recording a characteristic of the transmitted signal comprises recording a transmission delay of the test signal.

19. The method of claim 17, further comprising, causing the ATE to repeat said indexing, test signal transmission and calibration; wherein each repetition is associated with a different indexing of the mock wafer and test head connector.

* * * * *